(12) United States Patent
Tracy et al.

(10) Patent No.: US 7,950,611 B2
(45) Date of Patent: May 31, 2011

(54) COMPUTING DEVICE SUPPORT SYSTEM

(75) Inventors: Mark S. Tracy, Tomball, TX (US);
Jonathan R. Harris, Cypress, TX (US);
Paul J. Doczy, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 805 days.

(21) Appl. No.: 11/786,535

(22) Filed: Apr. 12, 2007

(65) Prior Publication Data
US 2008/0253081 A1 Oct. 16, 2008

(51) Int. Cl.
*F16M 11/04* (2006.01)
*G06F 1/16* (2006.01)

(52) U.S. Cl. .......... 248/176.3; 248/125.8; 248/455; 248/917; 361/679.27; 361/694

(58) Field of Classification Search .......... 248/685, 248/688, 676, 677, 455, 454, 370, 176.3, 248/125.8, 188.2, 188.5, 188.8, 458, 461, 248/349.1, 917; 361/679.01, 679.02, 679.27, 361/679.59, 681, 682, 683, 688, 690, 692, 361/694, 695
See application file for complete search history.

(56) References Cited

U.S. PATENT DOCUMENTS

| | | | | |
|---|---|---|---|---|
| 3,428,798 | A | * | 2/1969 | Hilzen ........... 362/217.1 |
| 4,856,748 | A | * | 8/1989 | Obermeyer ........... 248/688 |
| 5,247,285 | A | * | 9/1993 | Yokota et al. ........... 361/679.17 |
| 5,511,758 | A | | 4/1996 | Hsu |
| 5,823,504 | A | * | 10/1998 | Kuwajima ........... 248/685 |
| 6,098,952 | A | | 8/2000 | Tonn |
| 6,397,761 | B1 | * | 6/2002 | Moore ........... 108/147 |
| 6,474,614 | B2 | | 11/2002 | MacEachern |
| 6,511,039 | B1 | | 1/2003 | Nash |
| 7,066,438 | B2 | | 6/2006 | Ma |
| 7,111,948 | B2 | * | 9/2006 | Lee et al. ........... 353/119 |
| 7,128,003 | B2 | * | 10/2006 | Okninski ........... 108/147 |
| 7,168,665 | B2 | * | 1/2007 | Hong et al. ........... 248/125.1 |
| 7,301,759 | B2 | * | 11/2007 | Hsiung ........... 361/679.27 |
| 7,447,023 | B2 | * | 11/2008 | Chen et al. ........... 361/695 |
| 7,472,880 | B2 | * | 1/2009 | Ogawa et al. ........... 248/455 |
| 7,566,043 | B2 | * | 7/2009 | Chen ........... 248/616 |
| 2005/0258721 | A1 | * | 11/2005 | Hung ........... 312/223.1 |
| 2008/0062624 | A1 | * | 3/2008 | Regen et al. ........... 361/680 |
| 2008/0099638 | A1 | * | 5/2008 | Diener et al. ........... 248/176.3 |
| 2008/0137292 | A1 | * | 6/2008 | Chen et al. ........... 361/695 |

* cited by examiner

Primary Examiner — Tan Le

(57) ABSTRACT

A computing device comprising a support system extendable and retractable relative to a housing, the support system extending across a lateral dimension of the housing between a pair of housing sidewalls to support at least a portion of the housing in an elevated position relative to a support surface.

17 Claims, 3 Drawing Sheets

COMPUTING DEVICE SUPPORT SYSTEM

BACKGROUND

Computing devices, such as laptop or notebook computers, generate thermal energy during operation, which can result in a temperature of all or portions of the external surfaces of such devices to increase (e.g., the housing of the device). However, if the computing device is placed on a user's lap, for example, thermal energy generated by the computing device can be felt by the user, thereby creating an uncomfortable experience for the user.

DETAILED DESCRIPTION OF THE DRAWINGS

Various embodiments and the advantages thereof are best understood by referring to FIGS. 1-3B, like numerals being used for like and corresponding parts of the various drawings.

Figure 1:
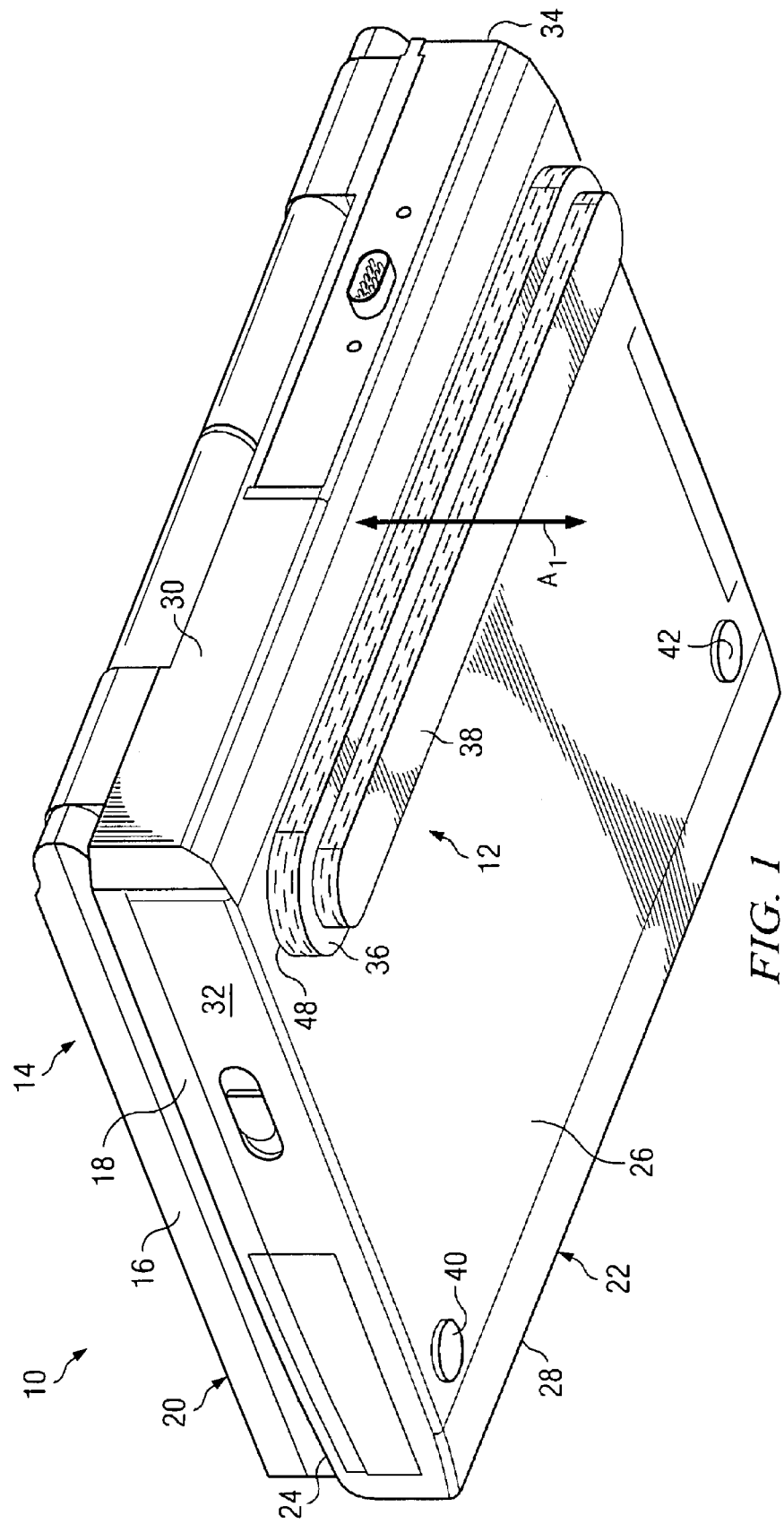
FIG. 1 is a diagram illustrating a bottom perspective view of a computing device in which an embodiment of a support system is employed to advantage.

FIG. 1 is a diagram illustrating a computing device 10 in which an embodiment of a support system 12 is employed to advantage. In the embodiment illustrated in FIG. 1, computing device 10 comprises a laptop or notebook computer 14; however, it should be understood that computing device 10 may comprise any type of computing device such as, but not limited to, a tablet personal computer, a personal digital assistant, a gaming device, or any other type of portable or non-portable computing device. In the embodiment illustrated in FIG. 1, computing device 10 comprises a display member 16 rotatably coupled to a base member 18. Display member 16 and base member 18 each comprise a housing 20 and 22, respectively, formed having a number of walls for storing operational components of computing device 10 therein (e.g., a motherboard, graphics card, etc.). For example, in FIG. 1, housing 22 comprises a top wall 24, a bottom wall 26, a front wall 28, a rear wall 30 and a pair of sidewalls 32 and 34.

In the embodiment illustrated in FIG. 1, support system 12 is disposed on and/or otherwise configured to extend outwardly from bottom wall 26. In FIG. 1, support system 12 extends substantially across a lateral dimension of housing 22 (e.g., extending laterally across bottom wall 26 between sidewalls 32 and 34 nearly an entire lateral dimension of bottom wall 26) to support at least a portion of housing 22 in a raised position (e.g., raising housing 22 such that at least a portion of bottom wall 26 is raised and/or spaced apart from a support surface, such as a table or a user's lap). In FIG. 1, support system 12 comprises an outer segment 36 and an inner segment 38 configured to extend in a telescopic manner relative to base member 18 from bottom wall 26. In the embodiment illustrated in FIG. 1, inner segment 38 is slideably engaged with an internal portion of outer segment 36, and outer segment 36 is slideably engaged with an opening 48 in housing 22 on bottom wall 26. Thus, in operation, segments 36 and 38 extend in a telescopic manner relative to each other and to bottom wall 26 to extend outwardly and retract inwardly relative to bottom wall 26. According to some embodiments, bottom wall 26 comprises a pair of support feet 40 and 42 for frictional engagement with a support surface that supports computing device 10 (e.g., a table, desk, floor, etc.). According to some embodiments, support feet 40 and 42 are formed from a rubber material to frictionally engage the support surface to prevent and/or substantially eliminate sliding of computing device 10 relative to the support surface when supported thereon.

In operation, support system 12 is employed to extend substantially across the lateral dimension of housing 22 such that when computing device 10 is supported on a user's lap, support system 12 contacts both legs of the user and thus raises bottom wall 26 and/or creates a gap between bottom wall 26 and the user's legs/lap, thereby substantially reducing and/or eliminating the likelihood of thermal energy that may dissipate from a bottom portion of the device 10 from reaching a user or other support structure. It should be understood that support system 12 may be otherwise configured (e.g., extending a length substantially less than the lateral dimension of housing 22 or having separate and/or spaced apart multiple support members adjacent sidewalls 32 and 34 of housing 22).

Figure 2A:
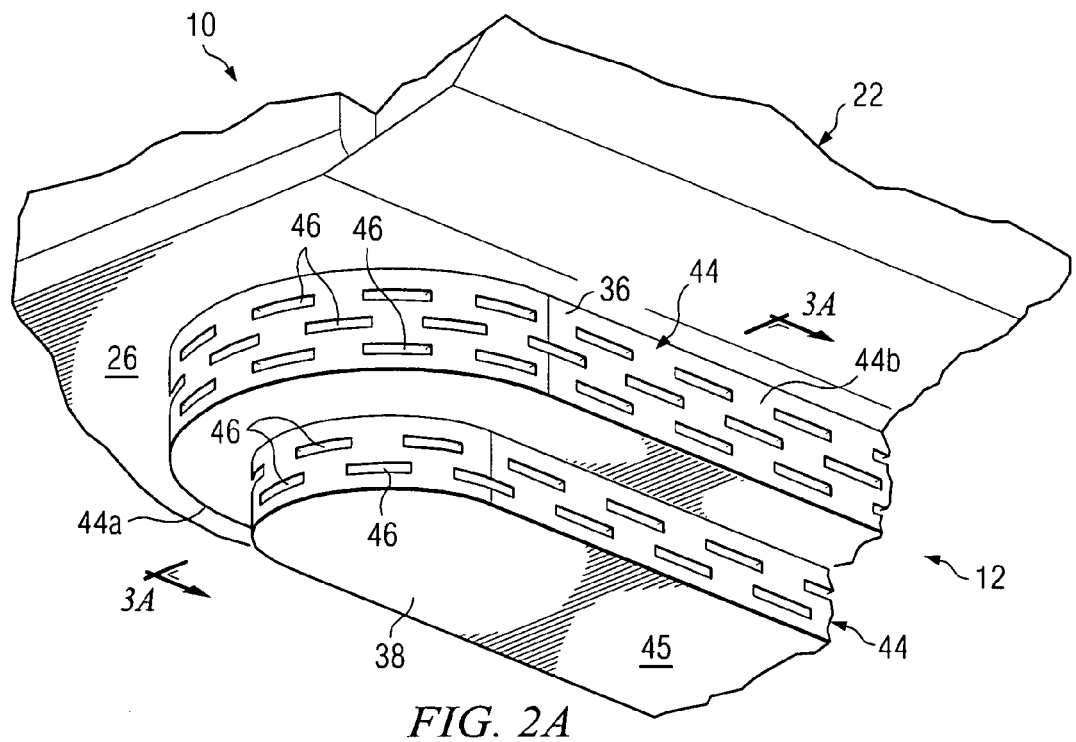
FIG. 2A is a diagram illustrating a bottom perspective view of a portion of the support system of FIG. 1 in an extended position.

FIG. 2A is a diagram illustrating a bottom perspective view of a portion of support system 12 of FIG. 1 in an extended position (e.g., all or at least a portion of segments 36 and/or 38 extending outwardly from bottom wall 26 to support computing device 10 in at least a partially elevated position relative to a support surface). In FIG. 2A, segment 36 and segment 38 are each configured having an airflow vent 44 to enable cooling air to enter housing 22, to enable warmed cooling air to exit housing 22, and/or enable an airflow to pass through segments 36 and/or 38 without entering/exiting housing 22. In FIG. 2, each airflow vent 44 is formed from a plurality of openings 46 disposed in respective segments 36 and 38. While segments 36 and 38 each comprise vent 44, it should be understood that vent 44 may be disposed solely within segment 36 or solely within segment 38. In the embodiment illustrated in FIG. 2A, each vent 44 extends along the entire (e.g., the entire or substantially entire) length of segments 36 and 38; however, it should be understood that vent 44 may be disposed on particular portions of segments 36 and/or 38 such as, for example, at the ends of support system 12 or at an intermediate portion of support system 12. In operation, airflow vent 44 provides an airflow path to enable cooling air to enter housing 22, enable warmed air to exit housing 22, and/or to enable an airflow to pass through segments 36 and/or 38 without entering/exiting housing 22, thereby facilitating conductive and/or convective cooling by enabling an airflow through support system 12 (e.g., an airflow through support system 12 such as, for example, entering vent 44 at rear wall 44a and exiting vent 44 at front wall 44b) to dissipate thermal energy associated with computing device 10.

Figure 2B:
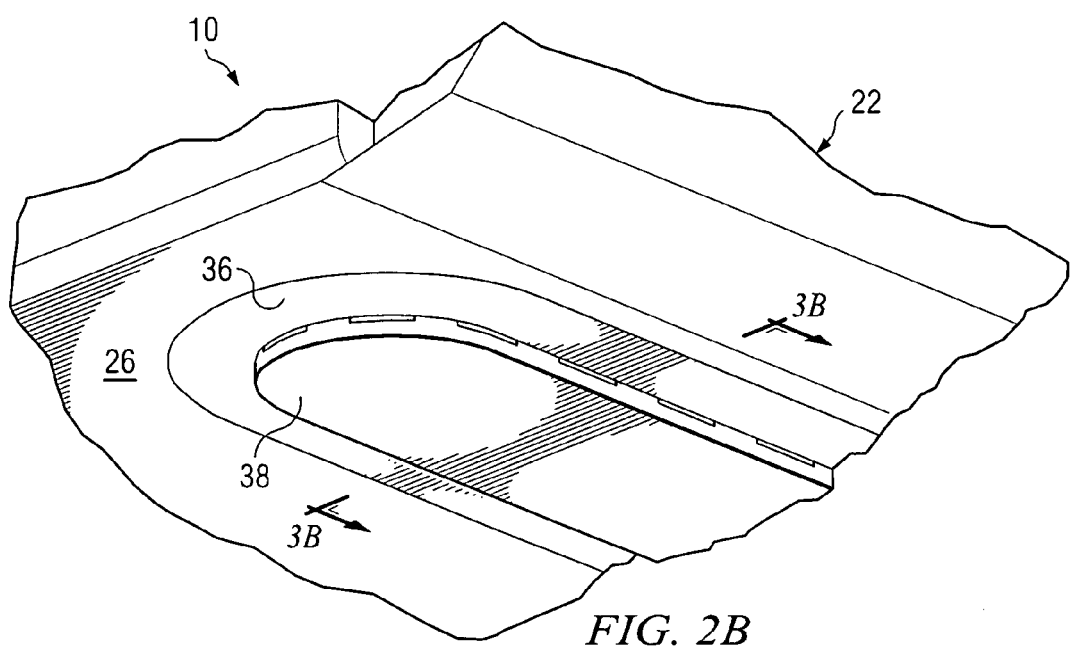
FIG. 2B is diagram illustrating a bottom perspective view of a portion of the support system of FIGS. 1 and 2A in a retracted position.

FIG. 2B is diagram illustrating a bottom perspective view of a portion of support system 12 of FIGS. 1 and 2A in a retracted position (e.g., all or at least a portion of segments 36 and/or 38 disposed within housing 22 of computing device 10). In the embodiment illustrated in FIG. 2B, segment 36 is fully retracted within housing 22 and segment 38 is at least partially retracted within segment 36. In some embodiments, when support system 12 is in the retracted position, segment 38 extends at least partially outward from bottom surface 26 to enable support system 12 to support computing device 10 when resting on a support surface (e.g., such that a support surface 45 of segment 38 is disposed coplanar with support surfaces of support feet 40 and 42 (FIG. 1)).

Figure 3A:
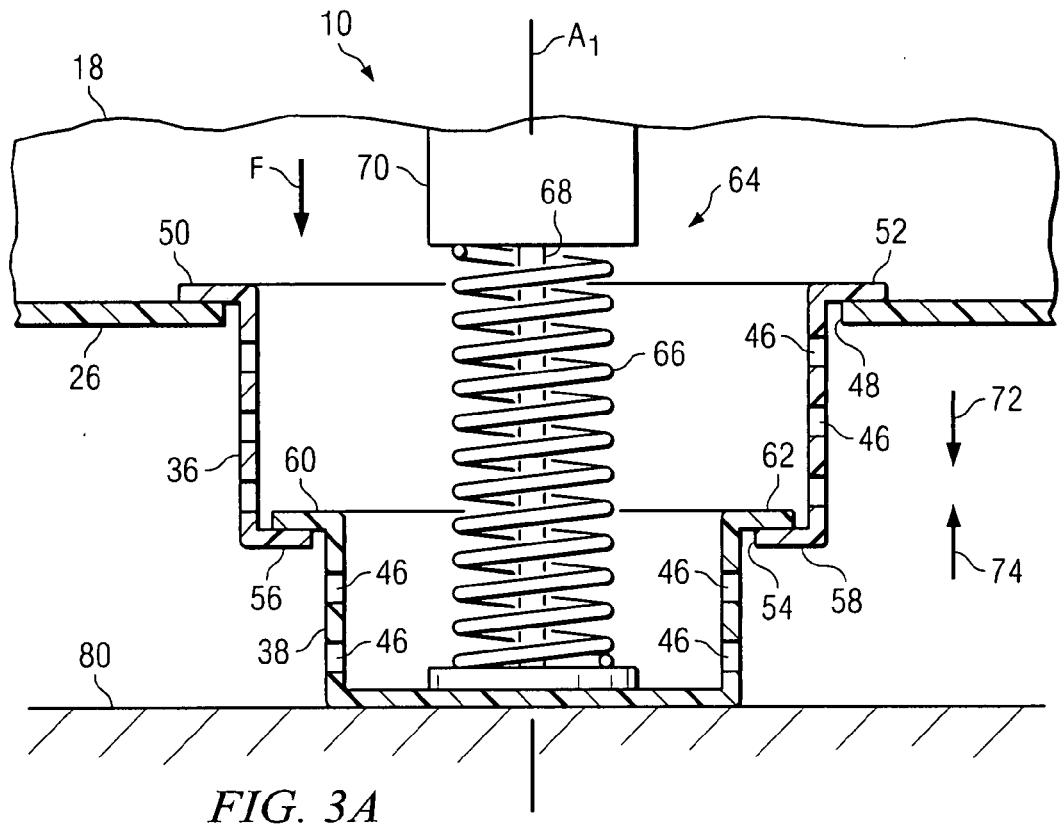
FIG. 3A is a diagram illustrating a section view of the support system of FIG. 2A taken along the line 3A-3A of FIG. 2A.
Figure 3B:
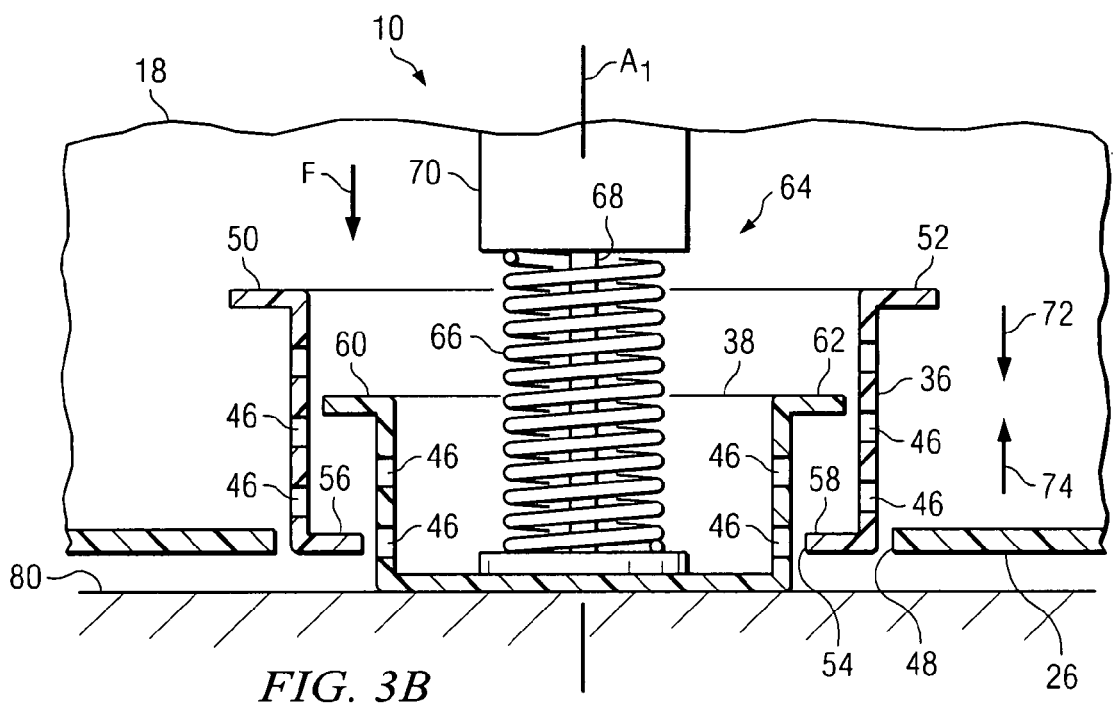
FIG. 3B is a diagram illustrating a section of the support system of FIG. 2B taken along the line 3B-3B of FIG. 2B.

FIG. 3A is a diagram illustrating a section view of support system 12 of FIG. 2A taken along the line 3A-3A of FIG. 2A. FIG. 3B is a diagram illustrating a section view of the support system 12 of FIG. 2B taken along the line 3B-3B of FIG. 2B. In the embodiment illustrated in FIGS. 3A and 3B, segments 36 and 38 are extendible/retractable in a telescopic manner in the directions of arrows 72 and 74 relative to base member 18, respectively. In FIGS. 3A and 3B, segments 36 and 38 extend outwardly from and/or retract relative to bottom surface 26 along an axis A1 (see also FIG. 1). In the embodiment illustrated in FIGS. 3A and 3B, segment 36 is disposed within opening 48 of housing 22 for slideable engagement therewith. Segment 36 comprises a pair of shoulders 50 and 52 to engage bottom wall 26 of housing 22 to prevent separation and/or overextension of segment 36 from housing 22. In operation, segment 36 is movable in the directions of arrows 72 and 74 relative to base member 18. In the embodiment illustrated in FIG. 3A, segment 36 comprises an opening 54 formed by shoulders 56 and 58 and configured to receive segment 38 therethrough for slideable engagement therewith. In operation, segment 38 is movable in the directions of arrows 72 and 74 relative to segment 36 and/or base member 18. Shoulders 50 and 52 of segment 36 engage a pair of corresponding shoulders 56 and 58 on segment 38 to prevent separation of and/or overextension of segment 38 relative to segment 36. Accordingly, when support system 12 is disposed in a fully extended position relative to base member 18, shoulders 50 and 52 engage bottom wall 26 and shoulders 56 and 58 engage corresponding shoulders 60 and 62 on segment 38.

In the embodiments illustrated in FIGS. 3A and 3B, support system 12 comprises two segments 36 and 38; however, it should be understood that a greater or fewer number of segments 36 and/or 38 may be utilized. For example, in some embodiments, support system 12 may comprise a single segment 36 or 38, or in the alternative, support system 12 may have segment(s) in addition to segments 36 and 38. In the embodiment illustrated in FIGS. 3A and 3B, support system 12 is disposed substantially within housing 22; however, it should be understood that support system 12 may be otherwise configured such that all or a portion of support system 12 is positionable in a retracted position at a location external to housing 22. According to some embodiments, support system 12 comprises telescoping segments 36 and/or 38 to minimize the height of housing 22 (e.g., utilizing less space in housing 22 for storage thereof).

In FIGS. 3A and 3B, support system 12 is movable between an extended position (FIG. 3A) and a retracted position (FIG. 3B) by a push-push mechanism 64. In the embodiment illustrated in FIGS. 3A and 3B, push-push mechanism 64 comprises a biasing mechanism 66, a rod 68 and a locking mechanism 70 to enable support system 12 to be releasably secured in either the extended position or the retracted position relative to base member 18. In some embodiments of operation, a force F is applied to computing device 10 in the direction of arrow 72 toward a support surface 80 to actuate push-push mechanism 64 (e.g., to actuate push-push mechanism between the retracted and extended positions). Upon actuation of push-push mechanism 64, biasing mechanism 66 exerts a force in the direction of arrow 72 to extend rod 68 and segments 36 and 38 (via engagement between shoulders 56 and 58 with shoulders 60 and 62) until support system 12 is configured in the extended position (FIG. 3A). Locking mechanism 70 secures rod 68 in an extended position to secure support system 12 in an extended position relative to base member 18. It should be understood that force F may also be applied directly to support system 12 to lock and/or release push-push mechanism 64.

To retract support system 12, a force F is applied in the direction of arrow 72 to unlock locking mechanism 70. Once locking mechanism 70 is unlocked, continued application of force F compresses biasing mechanism 66 and causes segments 36 and 38 to retract relative to housing 22. In FIG. 3B, force F is applied to computing device 10 until segment 36 is fully retracted within housing 22 and segment 38 is substantially retracted within segment 36, whereby locking mechanism 70 automatically secures rod 68 in a retracted position and thus segments 36 and 38 in a fully retracted position. It should be understood that system 12 may be otherwise configured in a fully retracted position (e.g., segment 36 only partially disposed within housing 22 and/or segment 38 fully disposed within segment 36 or housing 22). Further, it should be understood that other methods or mechanisms may be used to actuate and/or otherwise cause movement and securing of system 12 in the extended and retracted positions.

Thus, embodiments of support system 12 reduce and/or substantially eliminate the transfer of thermal energy from housing 22 to a support surface of computing device 10. Furthermore, embodiments of support system 12 provide an airflow vent 44 to enable cooling air to enter housing 22 and/or to enable warmed cooling air to exit housing 22, and/or to enable an airflow to pass through segments 36 and/or 38 without entering/exiting housing 22, thereby facilitating conductive and/or convective cooling by enabling an airflow through support system 12. Embodiments of system 12 also provide enhanced thermal energy dissipation resulting from more airflow beneath device 10 and, further, support system 12 consumes less space (e.g., less vertical height in base member 18 due to the telescoping expansion/retraction of support system 12.

What is claimed is:

1. A computing device, comprising:
a housing that extends between a pair of oppositely disposed sidewalls; and
a support system that includes an outer segment and an inner segment that telescopically extend from and telescopically retract into the housing, the outer and inner segments including a plurality of airflow vents that dissipate thermal energy generated by the computing device and the outer and inner segments extending across a lateral dimension of the housing between the pair of oppositely disposed sidewalls of the housing to support at least a portion of the housing in an elevated position relative to a support surface.

2. The computing device of claim 1, wherein the support system comprises a biasing mechanism that biases the outer and inner segments to an extended position away from a base of the computing device.

3. The computing device of claim 1, wherein the inner segment slideably engages in a telescopic manner with the outer segment, and the outer segment slideably engages in a telescopic manner with an opening in the housing.

4. The computing device of claim 1, the support system comprises a plurality of slideably engaged segments that telescopically extend from the housing and telescopically retract into the housing, wherein each of the plurality of slideably engaged segments includes plural airflow vents that cool the computing device.

5. The computing device of claim 1, wherein the computing device is a notebook computer.

6. A computing device, comprising:
- a support system with plural segments that are extendable and retractable relative to a housing to elevate at least a portion of the computing device relative to a support surface, the plural segments comprising an airflow vent to facilitate an airflow through the housing of the computing device to dissipate thermal energy generated by the computing device.

7. The computing device of claim 6, wherein the plural segments telescopically extend from the housing.

8. The computing device of claim 6, wherein the inner segment slideably engages in a telescopic manner with the outer segment, and the outer segment slideably engages in a telescopic manner with an opening in the housing.

9. The computing device of claim 6, wherein the computing device is a laptop computer.

10. The computing device of claim 6, wherein the airflow vent forms an airflow path from the support system into the housing of the computing device.

11. The computer device of claim 6, wherein all of the support system is disposed within the housing in a retracted position.

12. A notebook computer, comprising:
- a support system including segments that elevate at least a portion of the notebook computer relative to a support surface, the segments being telescopically coupled to a base of the notebook computer, extending across a lateral dimension of the base between two opposing sidewalls in an extended position, and retracting into the base in a retracted position, wherein the segments extend perpendicular with the base in the extended position.

13. The notebook computer of claim 12, wherein the segments comprises a plurality of airflow vents that dissipate heat generated by the notebook computer.

14. The notebook computer of claim 12, wherein the segments are telescopically movable between an extended position and a retracted position relative to the base of the notebook computer.

15. The notebook computer of claim 12, wherein at least one of the segments is slideably engaged with another one of the segments.

16. The notebook computer of claim 12, wherein at least a portion of the segments are disposed within the base of the notebook computer in a retracted position.

17. A computer, comprising:
- a base having a housing;
- a display that rotatably connects to the base; and
- a support system including a plurality of telescopically engaged segments that support at least a portion of the base of the computer in an elevated position relative to a support surface, the plurality of telescopically engaged segments extendable from a retracted position located within the base to an extended position and extending across a lateral dimension of the base between two opposing sidewalls, wherein the plurality of telescopically engaged segments extend perpendicular with the base in the extended position and retract into the base in the retracted position.

* * * * *

UNITED STATES PATENT AND TRADEMARK OFFICE
CERTIFICATE OF CORRECTION

| | | |
|---|---|---|
| PATENT NO. | : 7,950,611 B2 | Page 1 of 1 |
| APPLICATION NO. | : 11/786535 | |
| DATED | : May 31, 2011 | |
| INVENTOR(S) | : Mark S. Tracy et al. | |

It is certified that error appears in the above-identified patent and that said Letters Patent is hereby corrected as shown below:

In column 4, line 60, in Claim 4, after "claim 1," insert -- wherein --.

Signed and Sealed this
Twentieth Day of December, 2011

David J. Kappos
*Director of the United States Patent and Trademark Office*